(12) United States Patent
Matsukawa et al.

(10) Patent No.: US 11,048,167 B2
(45) Date of Patent: Jun. 29, 2021

(54) POSITIVE PHOTOSENSITIVE RESIN COMPOSITION, PATTERNED CURED FILM PRODUCTION METHOD, PATTERNED CURED FILM, AND ELECTRONIC COMPONENT

(71) Applicant: Hitachi Chemical Dupont Microsystems, Ltd., Tokyo (JP)

(72) Inventors: Daisaku Matsukawa, Tokyo (JP); Tetsuya Enomoto, Tokyo (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 48 days.

(21) Appl. No.: 15/545,751

(22) PCT Filed: Jan. 22, 2016

(86) PCT No.: PCT/JP2016/000323
§ 371 (c)(1),
(2) Date: Nov. 1, 2017

(87) PCT Pub. No.: WO2016/117347
PCT Pub. Date: Jul. 28, 2016

(65) Prior Publication Data
US 2018/0074403 A1     Mar. 15, 2018

(30) Foreign Application Priority Data

Jan. 23, 2015 (JP) .............................. JP2015-011638

(51) Int. Cl.
*G03F 7/023* (2006.01)
*G03F 7/40* (2006.01)
(Continued)

(52) U.S. Cl.
CPC ........... *G03F 7/0226* (2013.01); *C08G 69/32* (2013.01); *C08G 73/22* (2013.01); *C08K 5/03* (2013.01);
(Continued)

(58) Field of Classification Search
CPC ......... G03F 7/0226; G03F 7/0233; G03F 7/40
(Continued)

(56) References Cited

U.S. PATENT DOCUMENTS 6,232,032 B1 * 5/2001 Nunomura ............ G03F 7/0045
430/191
6,960,420 B2 * 11/2005 Komatsu ............... G03F 7/0233
430/270.1
(Continued)

FOREIGN PATENT DOCUMENTS

| CN | 101681100 A | 3/2010 |
|----|-------------|--------|
| CN | 101827880 A | 9/2010 |

(Continued)

OTHER PUBLICATIONS

Sakamaki et al., Effect of Polyimide Resin Film on Thermo-mechanical Stress of Low-k Layer during Bonding Process of Semiconductor Package, 18th Symposium on Microjoining and Assembly Technology in Electronics, Jan. 31-Feb. 1, 2012, pp. 449-450. (Cited in Specification).

(Continued)

*Primary Examiner* — John S Chu
(74) *Attorney, Agent, or Firm* — Fitch, Even, Tabin & Flannery, LLP

(57) ABSTRACT

A positive photosensitive resin composition comprising (a) polybenzoxazole precursor, (b) a cross-linking agent, (c) a diazonaphoquinone compound, (d) an iodonium compound and (e) a solvent.

9 Claims, 3 Drawing Sheets

(51) Int. Cl.

| | | |
|---|---|---|
| *G03F 7/022* | (2006.01) | |
| *C09D 179/04* | (2006.01) | |
| *C08G 69/32* | (2006.01) | |
| *C08G 73/22* | (2006.01) | |
| *C08K 5/03* | (2006.01) | |
| *C08K 5/42* | (2006.01) | |
| *C08L 75/04* | (2006.01) | |
| *C08G 71/04* | (2006.01) | |

(52) U.S. Cl.
CPC ............... *C08K 5/42* (2013.01); *C08L 75/04* (2013.01); *C09D 179/04* (2013.01); *G03F 7/023* (2013.01); *G03F 7/0233* (2013.01); *G03F 7/40* (2013.01); *C08G 71/04* (2013.01)

(58) Field of Classification Search
USPC .................................. 430/191, 192, 193, 325
See application file for complete search history.

(56) References Cited

U.S. PATENT DOCUMENTS

| | | | | |
|---|---|---|---|---|
| 7,615,324 | B2* | 11/2009 | Sato | G03F 7/0233 |
| | | | | 430/18 |
| 7,932,012 | B2* | 4/2011 | Komatsu | C08G 73/1025 |
| | | | | 430/270.1 |
| 8,298,747 | B2* | 10/2012 | Minegishi | C08L 79/04 |
| | | | | 430/270.1 |
| 9,274,422 | B2 | 3/2016 | Minegishi et al. | |
| 2008/0220222 | A1* | 9/2008 | Masayuki | C08K 5/13 |
| | | | | 428/195.1 |
| 2010/0196808 | A1 | 8/2010 | Mizushima et al. | |
| 2010/0239977 | A1 | 9/2010 | Banba | |
| 2010/0258336 | A1* | 10/2010 | Minegishi | C08G 73/22 |
| | | | | 174/250 |
| 2012/0263920 | A1* | 10/2012 | Ooe | C08K 5/13 |
| | | | | 428/161 |

FOREIGN PATENT DOCUMENTS

| | | |
|---|---|---|
| CN | 103502889 A | 1/2014 |
| JP | 11-119426 A | 4/1999 |
| JP | 2001-220443 A | 8/2001 |
| JP | 2003-043686 A | 2/2003 |
| JP | 2003-076007 A | 3/2003 |
| JP | 2007-304125 A | 11/2007 |
| JP | 2009-114266 A | 5/2009 |
| JP | 2010-229210 A | 10/2010 |
| JP | 2011-033772 A | 2/2011 |
| JP | 2011-197362 A | 10/2011 |
| TW | 200903148 A | 1/2009 |
| TW | 201434972 A | 9/2014 |
| WO | 2009/022732 A1 | 2/2009 |
| WO | 2010/001780 | 1/2010 |

OTHER PUBLICATIONS

Dill et al., Characterization of Positive Photoresist, IEEE Transactions on Electron Devices, vol. ED-22, No. 7, Jul. 1975, pp. 445-452. (Cited in Specification).

International Search Report of Appln. No. PCT/JP2016/000323 dated Feb. 16, 2016 in English.

Written Opinion of PCT/JP2016/000323 dated Aug. 3, 2017 in English.

* cited by examiner

POSITIVE PHOTOSENSITIVE RESIN COMPOSITION, PATTERNED CURED FILM PRODUCTION METHOD, PATTERNED CURED FILM, AND ELECTRONIC COMPONENT

CROSS-REFERENCE TO RELATED APPLICATIONS

This application is a U.S. national phase application filed under 35 U.S.C. § 371 of International Application PCT/JP2016/000323, filed on Jan. 22, 2016, designating the United States, which claims benefit of the filing dates of JP 2015-011638, filed Jan. 23, 2015, which is hereby incorporated herein by reference in its entirety.

TECHNICAL FIELD

The invention relates to a positive photosensitive resin composition, a method for producing a patterned cured film, a patterned cured film and an electronic component.

BACKGROUND ART

Polybenzoxazole has good heat resistance and high stability against various chemicals, and hence it is applied as a circuit surface protective film material for semiconductor elements and a rewiring layer-forming material in a wafer level package (Patent Documents 1 and 2).

Further, as for polybenzoxazole, by applying a positive photosensitive resin composition obtained by combining a precursor of polybenzoxazole and a diazonaphthoquinone compound (a naphthoquinone diazide compound) on a substrate, drying the applied resin composition, followed by curing by heating after light exposure and development steps, it is possible to easily obtain a patterned cured film containing polybenzoxazole. Due to the above-mentioned process, it is possible to obtain a patterned cured film in which only a connecting terminal part of a semiconductor element circuit is opened (Patent Documents 3 and 4), for example. In the opened patterned part, an external connection terminal called a bump comprised of a solder or copper is formed.

Conventionally, positive photosensitive resin compositions were used such that the film thickness after curing became in a range of about 5 to 10 μm. Therefore, taking into consideration a decrease in thickness at the time of development or shrinkage by curing, the exposure and development step is set such that a film thickness of about 10 to 15 μm is attained.

RELATED ART DOCUMENTS

Patent Documents

Patent Document 1: WO2009/022732
Patent Document 2: JP-A-2007-304125
Patent Document 3: JP-A-2010-229210
Patent Document 4: JP-A-2011-197362

Non-Patent Document

Non-Patent Document 1: Issei Sakamaki, et. al., "Effects of Polyimide Resin Protective Film on Thermomechanical Stress of Low-k Layer Generated During Joining of Semiconductor Packages," Proceedings of 18th Symposium on Microjoining and Assembly Technology in Electronics, pp 449-450, 2012

SUMMARY OF THE INVENTION

In recent years, there has been a further increasing demand for enhancing reliability of a semiconductor element. In order to relax stress acting on a semiconductor element circuit or a bump, an increase in thickness of a protective film or a rewiring layer is required (Non-Patent Document 1). As for the film thickness, a thickness of 15 μm or more after curing is required. Taking into consideration a decrease in thickness during development or curing, it is required to conduct exposure and development in a film thickness of 20 μm or more.

By the way, in a positive photosensitive resin composition obtained by combining a polybenzoxazole precursor and a diazonaphthoquinone compound, since a phenolic hydroxyl group of a polybenzoxazole precursor interacts with a diazonaphthoquinone compound, solubility of the polybenzoxazole precursor in an aqueous alkali solution is inhibited.

On the other hand, a diazonaphoquinone compound is converted to indene carboxylic acid by light exposure, and the interaction disappears. Therefore, solubility of a polybenzoxazole precursor in an aqueous alkali solution is improved.

As a result, since the dissolution speed of an exposed part in an aqueous alkaline solution becomes faster than the dissolution speed of an unexposed part in an aqueous alkaline solution (since the dissolution contrast (the ratio of the dissolution speed of an exposed part to the dissolution speed of an unexposed part)) becomes large), formation of a pattern becomes possible.

The inventors of the present invention attempted to form a pattern with a film thickness of 20 μm or more by using a conventional positive photosensitive resin composition. As a result, in the exposed part, the emitted light did not sufficiently reach the bottom part of the film, and conversion of the diazonaphthoquinone compound to indene carboxylic acid was insufficient, and there was a case where the opened pattern could not be formed. In addition, there was a case where, since the amount of a resin to be removed by dissolution increases, the development time was prolonged.

In the unexposed part, dissolution in a developing solution gradually proceeds, and as a result, the residual film ratio (the ratio of the film thickness after development to the initial film thickness) may be lowered or pattern peeling may occur. Under such circumstances, if a dissolution inhibitor other than a diazonaphthoquinone compound is added in order to suppress lowering in the residual film ratio, the effect of dissolution inhibition by the dissolution inhibitor does not disappear even in the exposed part, and the development time may be further prolonged.

The inventors of the invention made extensive studies on the above-mentioned problem associated with an increase in thickness. As a result, the inventors have found that, by combining a polybenzoxazole precursor having a specific structure, a diazonaphthoquinone compound and an iodonium compound having a specific structure, if an attempt is made to form a pattern with a thickness of 20 μm or more, development is possible within a practically implementable development time and a pattern can be formed while maintaining a high residual film ratio. The invention has been attained based on this finding. According to the invention, the following positive photosensitive resin composition and the like are provided.

1. A positive photosensitive resin composition comprising the following components (a) to (e):
(a) a polybenzoxazole precursor comprising a structural unit represented by the following formula (1):

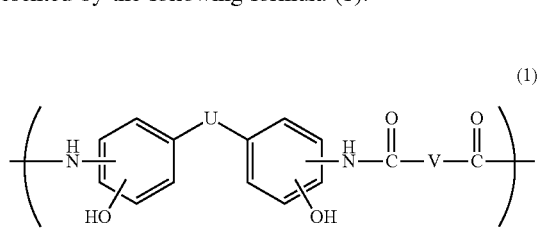

(1)

wherein in the formula, U is a divalent organic group and V is a divalent organic group comprising an aliphatic chain structure or an alicyclic structure;
(b) a cross-linking agent;
(c) a diazonaphthoquinone compound;
(d) an iodonium compound represented by the following formula (2) or (3);

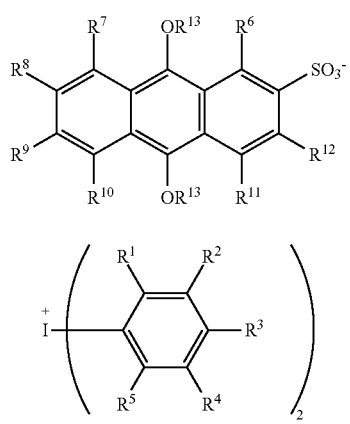

(2)

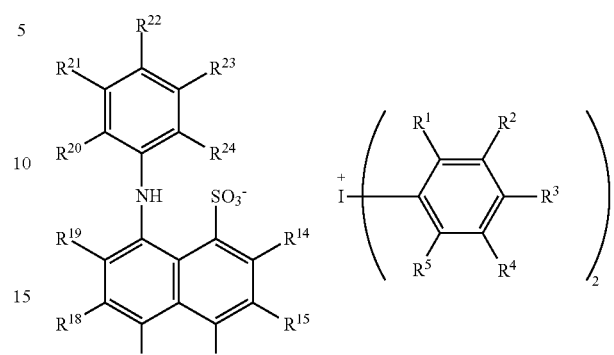

(3)

wherein in the formula, $R^1$ to $R^{12}$ and $R^{14}$ to $R^{24}$ are independently a hydrogen atom, a chlorine atom, a bromine atom, an iodine atom, a fluorine atom, an alkyl group, an alkenyl group, an alkoxyl group, a trialkylsilyl group or a group in which a part or all of hydrogen atoms in each of the above-mentioned groups are substituted by a fluorine atom; $R^{13}$ is an alkyl group; and two $R^1$s, two $R^2$s, two $R^3$s, two $R^4$s, two $R^5$s and two $R^{13}$s may be the same as or different from each other; and (e) a solvent.

2. The positive photosensitive resin composition according to 1, wherein the component (a) is a polybenzoxazole precursor having a structure represented by the following formula (4):

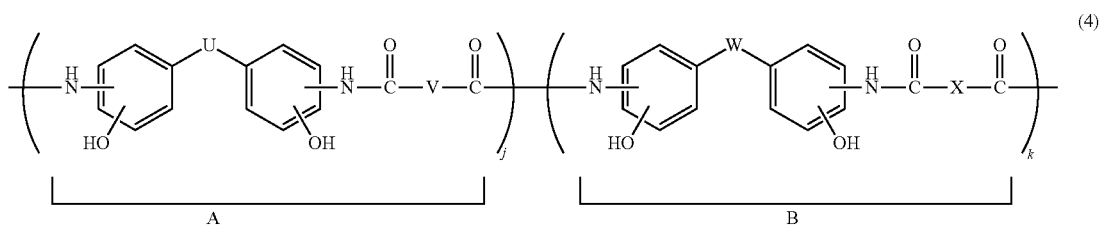

(4)

wherein A and B are structural units;
U is a divalent organic group;
V is a divalent organic group comprising an aliphatic chain structure or an alicyclic structure;
W is a divalent organic group;
X is a divalent organic group which comprises neither an aliphatic structure nor an alicyclic structure; and
j and k each represent a polymerization ratio in terms of moles of the structural units A and B, j is a value of 1 or more, and j+k is 100.
3. The positive photosensitive resin composition according to 1 or 2 that further comprises the following component (a'):
(a') a polybenzoxazole precursor that comprises a structural unit represented by the following formula (5) and does not comprise a structural unit represented by the above formula (1):

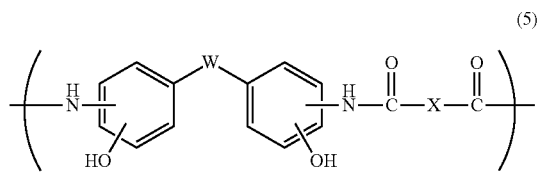

(5)

wherein W is a divalent organic group and X is a divalent organic group that comprises neither an aliphatic chain structure nor an aliphatic structure.
4. The positive photosensitive resin composition according to any one of 1 to 3, which is used for a surface protective film of a semiconductor device having an under-bump metal free structure.
5. A method for producing a patterned cured film comprising:
a resin film-forming step in which the positive photosensitive resin composition according to any one of 1 to 4 is applied to a substrate, followed by drying to form a resin film;
a light exposure step in which the resin film is exposed to light with a prescribed pattern;
a development step in which the resin film after the light exposure is developed by using an aqueous alkaline solution to obtain a patterned resin film; and
a heat-treatment step in which the patterned resin film is heat-treated to obtain a patterned cured film.
6. The method for producing a patterned cured film according to 5, wherein the thickness of the resin film is 20 μm or more, and the thickness of the patterned cured film is 15 μm or more.
7. A patterned cured film of the positive photosensitive resin composition according to any one of 1 to 4.
8. An electronic component comprising the patterned cured film according to 7.

According to the invention, it is possible to provide a positive photosensitive resin composition exhibiting good developability and residual film ratio even if an attempt is made to form a pattern in a thickness as large as 20 μm or more, a patterned cured film and a method for producing the same.

Specifically, in the positive photosensitive resin composition of the invention, by using a polybenzoxazole precursor exhibiting a high transmittance to an exposure light wavelength (365 nm) due to a specific structure incorporated, it is possible to sufficiently expose to light the diazonaphthoquinone compound at the bottom part of a thick film, and by combining an iodonium compound having a specific structure, it is possible to suppress the dissolution speed of an unexposed part and to promote the dissolution speed of an exposed part. As a result, even if a thick patterned cured film is formed, an excellent pattern formation is possible with excellent workability (i.e. enable to be developed within a practically implementable developing time) while maintaining a high residual film ratio.

MODE FOR CARRYING OUT THE INVENTION

Figure 1:
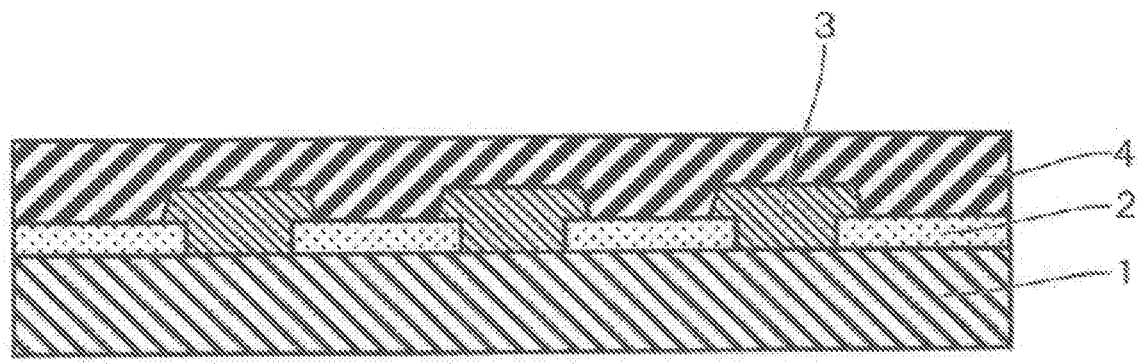
FIG. 1 is a schematic cross-sectional view showing a first step for producing a semiconductor device that is fabricated by using the positive photosensitive resin composition of the invention.

Hereinbelow, a detail explanation will be given on the mode for carrying out the invention. The invention is not limited by the following embodiments. In the specification, the expression "A or B" means that either one of A and B may be contained or both of A and B may be contained. In addition, in the specification, the term "step" means not only an independent step. If one step cannot be clearly distinguished from other steps, such step is included in the "step" as long as effects intended to be exerted by this step is attained.

The numerical range expressed by "to" indicates a range including the numerical values given before and after the "to" as the minimum value and the maximum value, respectively. In the specification, the content of each component in the composition means, if a plurality of substances corresponding to each component are present in the composition, the total amount of said plurality of substances present in the composition unless otherwise indicated. Further, the materials exemplified may be used singly or in combination of two or more, unless otherwise indicated.

The positive photosensitive resin composition comprises the following components (a) to (e):

(a) a polybenzoxazole precursor comprising a structural unit represented by the following formula (1):

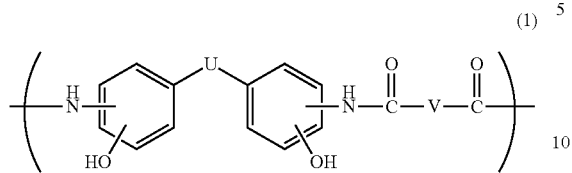
(1)

wherein in the formula, U is a divalent organic group and V is a divalent organic group comprising an aliphatic chain structure or an alicyclic structure;

(b) a cross-linking agent;

(c) a diazonaphthoquinone compound;

(d) an iodonium compound represented by the following formula (2) or (3);

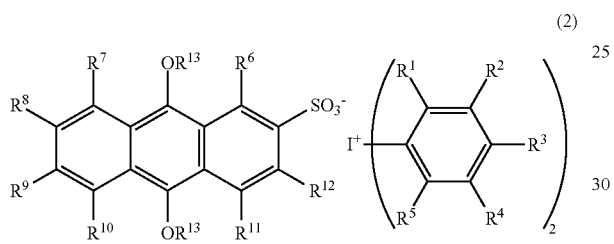
(2)

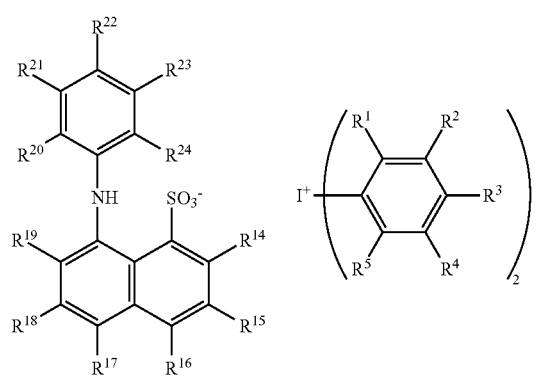
(3)

wherein in the formula, $R^1$ to $R^{12}$ and $R^{14}$ to $R^{24}$ are independently a hydrogen atom, a chlorine atom, a bromine atom, an iodine atom, a fluorine atom, an alkyl group, an alkenyl group, an alkoxyl group, a trialkylsilyl group or a group in which a part or all of hydrogen atoms in each of the above-mentioned groups are substituted by a fluorine atom; $R^{13}$ is an alkyl group; and two $R^1$s, two $R^2$s, two $R^3$s, two $R^4$s, two $R^5$s and two $R^{13}$s may be the same as or different from each other; and (e) a solvent.

Hereinbelow, an explanation will be given on each component.

In the invention, no specific restrictions are made on the polybenzoxazole precursor as the component (a), as long as it comprises the structural unit represented by the following formula (1):

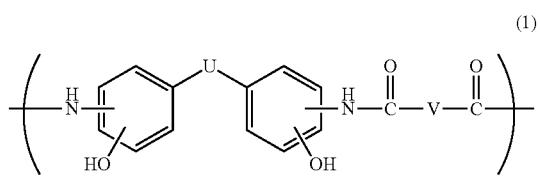
(1)

wherein in the formula, U is a divalent organic group, and V is a divalent organic group comprising an aliphatic chain structure or an alicyclic structure.

The divalent organic group represented by U is preferably a group (preferably an alkylene group or a fluorinated alkylene group) comprising an aliphatic structure having 1 to 30 (preferably 1 to 10, more preferably 1 to 6) carbon atoms. It is more preferred that the divalent organic group represented by U be a group including a structure represented by the following formula:

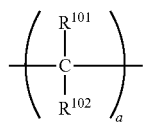

wherein in the formula, $R^{101}$ and $R^{102}$ are independently a hydrogen atom, a fluorine atom, an alkyl group having 1 to 6 carbon atoms or a fluorinated alkyl group having 1 to 6 carbon atoms, and a is an integer of 1 to 30.

In respect of transparency of the polybenzoxazole precursor, $R^{101}$ and $R^{102}$ are preferably a methyl group or a trifluoromethyl group, with a trifluoromethyl group being more preferable. a is preferably an integer of 1 to 5.

It is preferred that V be a group comprising an aliphatic chain structure (preferably an alkyl group or a fluorinated alkylene group) having 1 to 30 (preferably 3 to 20, more preferably 5 to 15) carbon atoms. Further, it is preferred that V be a group comprising an alicyclic structure (preferably a cycloalkylene group or a fluorinated cycloalkylene group, both of which may be either monocyclic or polycyclic) having 3 to 10 (preferably 3 to 7, more preferably 5 to 6) carbon atoms. The group comprising an alicyclic group may be substituted by an alkyl group having 1 to 6 carbon atoms.

As the polybenzoxazole precursor comprising the structural unit represented by the formula (1), a polybenzoxazole precursor comprising a structural unit represented by the following formula (4) can be used. This polybenzoxazole precursor may be a copolymer composed of the structural units A and B. The copolymer may be a block copolymer or a random copolymer.

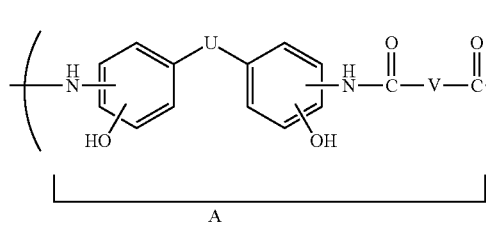
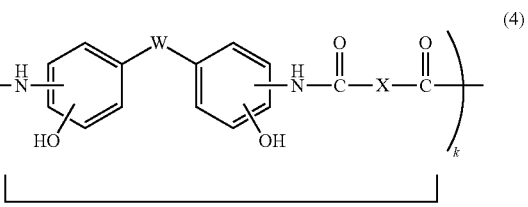

(4)

A    B wherein A and B are structural units, U is a divalent organic group, and V is a divalent organic group comprising an aliphatic chain structure or an alicyclic structure. U and V are the same as U and V in the formula (1).

W is a divalent organic group, and X is a divalent organic group that comprises neither an aliphatic chain structure nor an alicyclic structure. W is the same as U in the formula (1).

It is preferred that X be a group comprising an aromatic ring (preferably a benzene ring or a naphthalene ring). Specifically, the following groups are more preferable. These groups may be substituted by a halogen.

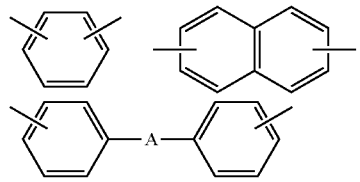

wherein A is a single bond, —O— or —S—.

j and k in the formula (4) represent a polymerization ratio in terms of mole of the structural units A and B. j is a value of 1 or more, and j+k=100. k is preferably 1 or more.

The values of j and k can be arbitrarily set in a range of j=1 to 99 and k=1 to 99. In respect of solubility in an aqueous alkaline solution, mechanical properties or heat resistance of a cured film and chemicals resistance, j is preferably 5 to 90 and k is preferably 10 to 95, and more preferably j is 10 to 85 and k is 15 to 90.

The polybenzoxazole precursor used in the invention may have a structural unit of polyamide or a structural unit of polybenzoxazole other than the structural unit represented by the formula (1), a structural unit of polyimide or a polyimide precursor (polyamide acid or a polyamide acid ester) together with the structural unit represented by the formula (1) or with the structure unit A and the structural unit B represented by the formula (4) that shows the case of a copolymer.

When the photosensitive resin composition comprises a polybenzoxazole precursor comprising the structural unit represented by the formula (1), where a resin film is formed from the resin composition, light transmittance at the exposure light wavelength of 365 nm (i-ray), that is used for converting a diazonaphthoquinone compound into indene carboxylic acid, is increased. When a thick patterned cured film is formed, light easily reaches the bottom part of the film.

Further, in order to improve heat resistance of a cured film, a polybenzoxazole precursor that comprises a structural unit represented by the following formula (5) and does not comprise a structural unit represented by the above formula (1) may be added.

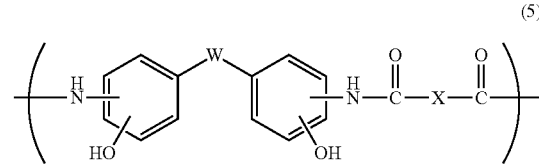

(5)

wherein in the formula, W is a divalent organic group and X is a divalent organic group that comprises neither an aliphatic chain structure nor an alicyclic structure. W and X are the same as W and X in the formula (4).

When two or more types of polybenzoxazole precursors are combined, the mixing ratio may be appropriately adjusted taking into consideration the i-ray transmittance.

The divalent organic group represented by U in the formula (1), U and W in the formula (4) and W in the formula (5) is a residue of a hydroxyl group-containing diamine used for synthesizing a polybenzoxazole precursor. Examples of the hydroxyl group-containing diamine include, but not limited to, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, and the like.

V in the formulas (1) and (4) is a divalent organic group. Specifically, it is a residue of dicarboxylic acids which is reacted with the hydroxyl group-containing diamine to form a polyamide structure, and includes an aliphatic chain structure or an alicyclic structure. The polybenzoxazole precursor in which these structures are introduced improves transmittance to ultraviolet and visible lights, and the lights are therefore easily reached to the bottom of the film when the cured film of the thick film is formed.

In addition, it is preferable that an aliphatic chain structure be present, because dehydration/ring-closing reaction of the polybenzoxazole precursor is more likely to proceed at a low temperature, resulting in excellent curability. Further, from the viewpoint of mechanical properties, it is preferable that V be an aliphatic straight chain structure having 7 to 30 carbon atoms, because the breaking elongation of the cured film is improved.

Examples of the dicarboxylic acids containing an aliphatic chain structure having 1 to 30 carbon atoms include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and the dicarboxylic acid represented by the following formulas:

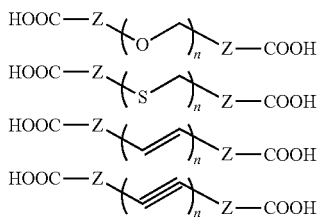

wherein in the formulas, Z is an alkyl group having 1 to 6 carbon atoms, and n is an integer of 1 to 6.

Examples of the dicarboxylic acid containing an alicyclic structure include 1,1-cyclobutanedicarboxylic acid, 1,2-cyclohexanedicarboxylic acid, 1,3-cyclopentanedicarboxylic acid, 1,4-cyclohexanedicarboxylic acid, 2,3-norbornandicarboxylic acid, 1,3-adamantanedicarboxylic acid, and the like.

The dicarboxylic acids used as X in the formulas (4) and (5) are dicarboxylic acids, other than the dicarboxylic acids containing the aliphatic chain structure or the alicyclic structure, and include aromatic dicarboxylic acids such as isophthalic acid, terephthalic acid, 4,4'-dicarboxylbiphenyl, 4,4'-dicarboxyldiphenyl ether, 4,4'-dicarboxyltetraphenylsilane, bis(4-carboxyphenyl)sulfone, 5-bromoisophthalic acid, 5-fluoroisophthalic acid, 5-chloroisophthalic acid, 2,6-naphthalenediarboxylic acid, and the like, from the viewpoint of improving heat resistance after conversion to polybenzoxazole.

The amide bond moiety containing phenolic hydroxyl groups in the polybenzoxazole precursor represented by the formulas (1), (4) and (5) is converted by the dehydration/ring-closing on curing to a benzoxazole structure, which is excellent in heat resistance, mechanical properties, and electrical properties.

The molecular weight of the polybenzoxazole precursor is preferably from 3,000 to 200,000, more preferably from 5,000 to 100,000, especially more preferably from 10,000 to 40,000 in weight-average molecular weight. The weight-average molecular weight can be measured by gel permeation chromatography with reference to the examples of the specification.

In the present invention, the method for producing the polybenzoxazole precursor is not particularly limited, and it can be produced by a conventionally known method. For example, a polybenzoxazole precursor having a structural unit represented by the formula (1) can be generally synthesized from a dicarboxylic acid derivative and a hydroxy group-containing diamine. Specifically, it can be synthesized by converting a dicarboxylic acid derivative into a dihalide derivative and then reacting with the diamine.

The positive photosensitive resin composition of the present invention comprises a cross-linking agent as the component (b). The cross-linking agent is a compound which can be cross-linked or polymerized by heating. By including such a compound, the cross-linking structure can be formed by reacting with the polybenzoxazole precursor during curing by heating. In addition, the compounds can also self-polymerize by heating. Therefore, heat resistance, mechanical properties and chemical resistance can be improved.

The cross-linking agent as the component (b) is not particularly limited, but is preferably a compound having a methylol group, an alkoxymethyl group, an epoxy group, an oxetanyl group or a vinyl ether group, and is more preferably a compound having a methylol group or an alkoxymethyl group.

Specifically, compounds represented by the following formulas (6) to (8) are preferable as the compound that can be used as the component (b). A compound having two or more methylol groups or alkoxymethyl groups is preferable in the viewpoint of sensitivity and stability of the varnish, and additionally in that melting of the film can be prevented on curing of the film after pattern formation.

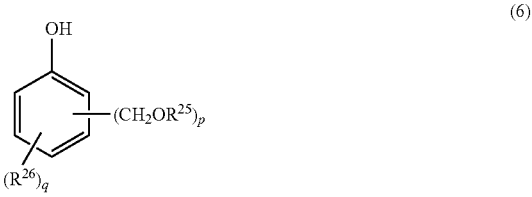

wherein in the formula, $R^{25}$ represents a hydrogen atom or an alkyl group, $R^{26}$ represents an alkyl group, p is an integer of 1 to 4, q is an integer of 0 to 3, p+q is an integer of 5 or less, and when there are a plurality of $R^{25}$ or $R^{26}$, they may be the same or different from each other.

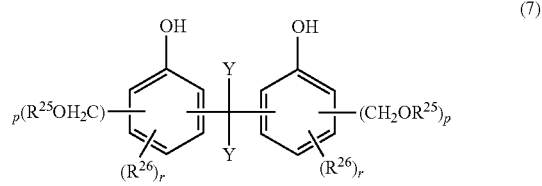

wherein in the formula, the two Ys are independently a hydrogen atom, an alkyl group having 1 to 10 carbon atoms, a fluoroalkyl group in which some or all of the hydrogen atoms thereof are substituted with fluorine atoms, a hydroxyalkyl group in which some or all of the hydrogen atoms thereof are substituted with hydroxyl groups, or an alkoxy group having 1 to 10 carbon atoms; $R^{25}$ represents a hydrogen atom or an alkyl group; $R^{26}$ represents an alkyl group; p is independently an integer of 1 to 4; r is independently an integer of 0 to 3; p+q is an integer of 5 or less; and when there are a plurality of $R^{25}$ or $R^{26}$, they may be the same or different from each other.

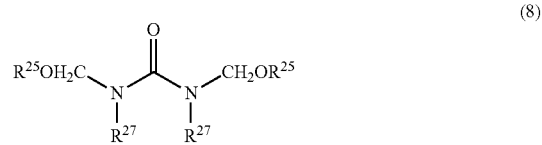

wherein in the formula, two $R^{25}$s represent a hydrogen atom or an alkyl group; two $R^{27}$s independently represents a hydrogen atom or a monovalent organic group, and they may be bonded to each other to form a substituted or unsubstituted ring structure.

Among the forgoing, the compound represented by the formula (8) is particularly preferable with respect to obtaining a cured film having high chemical resistance even if it is cured at a low temperature of 200° C. or less.

Further, with respect to environmental compatibility such as availability and chemical resistance of the cured film, it is preferable to use the following compounds.

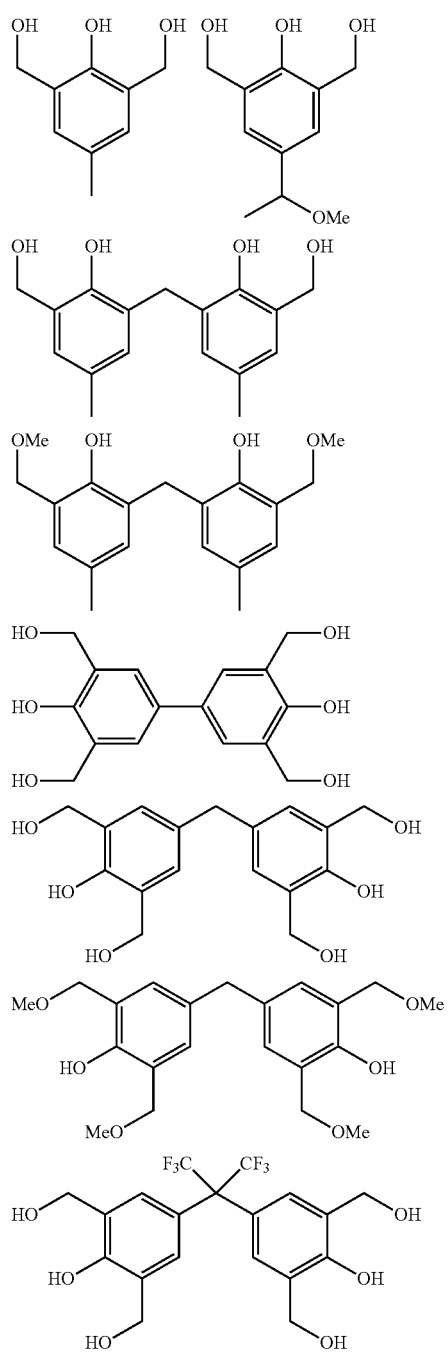

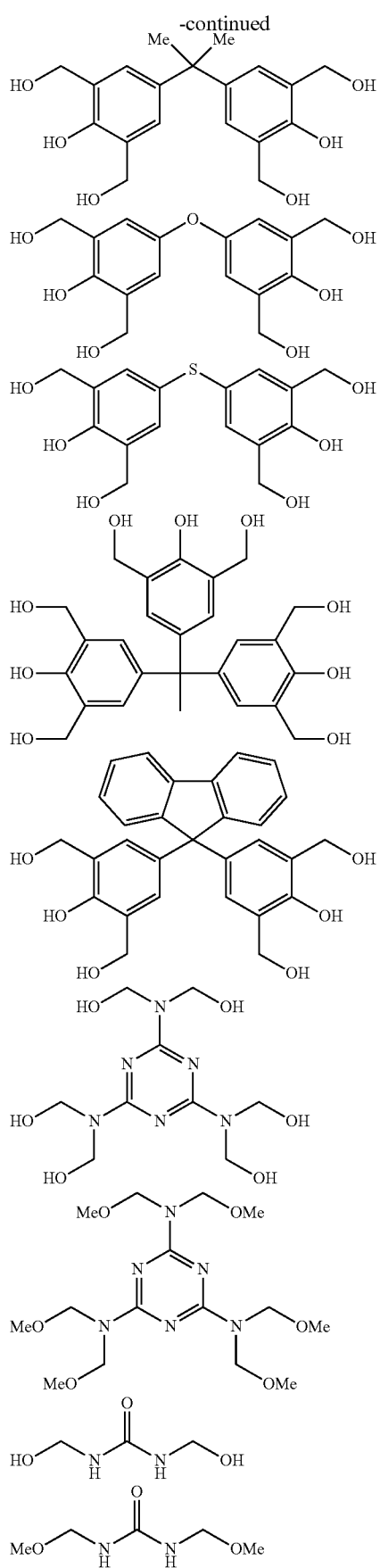

-continued

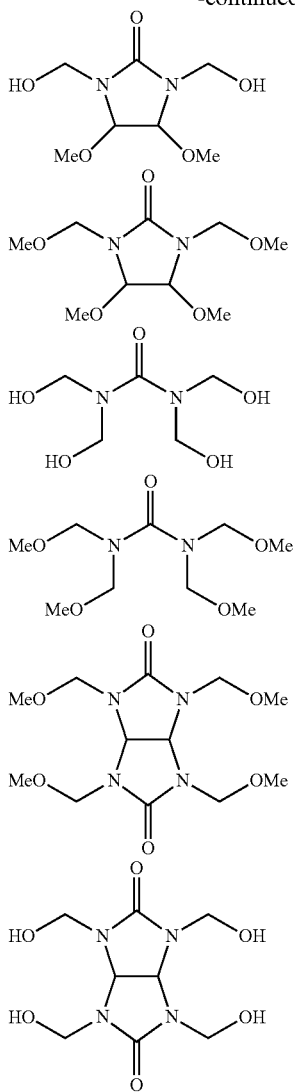

With respect to heat resistance of the cured film, the content of the component (b) is preferably 1 to 50 parts by mass based on 100 parts by mass of the component (a), and with respect to improving chemical resistance and flux resistance, it is more preferably 5 to 40 parts by mass, still more preferably 10 to 35 parts by mass.

The positive photosensitive resin composition of the present invention comprises a diazonaphthoquinone compound as the component (c). As the diazonaphthoquinone compound, a conventionally known compounds can be used without any particular limitation.

The diazonaphthoquinone compound can be obtained, for example, by subjecting o-quinonediazidesulfonyl chlorides and a hydroxy compound, an amino compound or the like to a condensation reaction in the presence of a dehydrochlorinating agent. As the o-quinonediazidesulfonyl chlorides, benzoquinone-1,2-diazide-4-sulfonyl chloride, naphthoquinone-1,2-diazido-5-sulfonyl chloride, naphthoquinone-1,2-diazido-4-sulfonyl chloride or the like can be used.

As the hydroxy compound, hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane or the like can be used.

As the amino compound, p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, bis(4-amino-3-hydroxyphenyl)hexafluoropropane or the like can be used.

The content of the diazonaphthoquinone compound may be appropriately adjusted in view of dissolution contrast and the like. In particular, in the case of forming a cured film of a thick film, with respect to preventing deterioration of the resolution of the opened pattern, which is caused by reason that the diazonaphthoquinone compound itself absorbs the i-ray and the i-ray does not reach the film bottom, 1 to 20 parts by mass is preferable and 5 to 15 parts by mass is more preferable relative to 100 parts by mass of the component (a).

The positive photosensitive resin composition of the present invention comprises an iodonium compound represented by the formula (2) or (3) as the component (d). Generally, the polybenzoxazole precursor has weaker interaction with the diazonaphthoquinone compound as compared with the novolak resin. Therefore, in order to sufficiently lower the dissolution rate of the unexposed part, an iodonium compound which is a dissolution inhibitor may be used in combination. However, even if the diazonaphthoquinone compound is converted to by exposure indene carboxylic acid, thereby losing interaction, the dissolution inhibiting effect by the iodonium compound does not disappear. Therefore, the dissolution rate of the exposed part is suppressed, and the dissolution contrast may be lowered, or the developing time may be prolonged.

The iodonium compound represented by the formula (2) or (3) can absorb i-ray and be decomposed by exposure to eliminate the dissolution inhibiting effect.

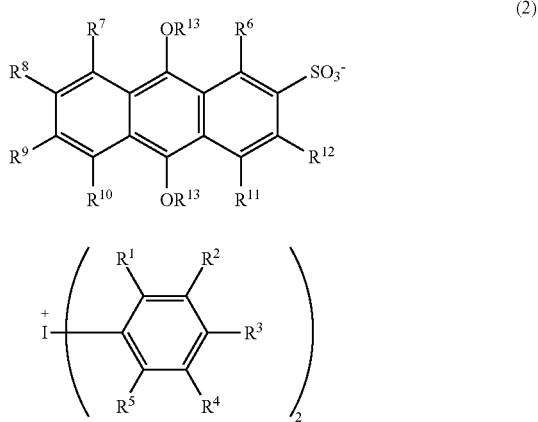

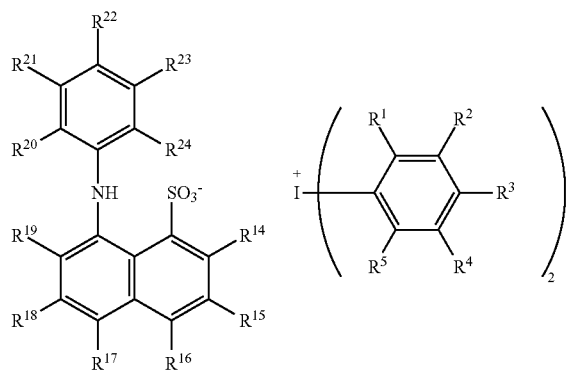

(3)

In the formulas (2) and (3), $R^1$ to $R^{12}$ and $R^{14}$ to $R^{24}$ each represent a hydrogen atom, a chlorine atom, a bromine atom, an iodine atom, a fluorine atom, an alkyl group (preferably having 1 to 10 carbon atoms, more preferably having 1 to 6 carbon atoms), an alkenyl group (preferably having 1 to 10 carbon atoms, more preferably having 1 to 6 carbon atoms), an alkoxyl group (preferably having 1 to 10 carbon atoms, more preferably having 1 to 6 carbon atoms), a trialkyl silyl group (preferably having 1 to 30 carbon atoms, more preferably having 1 to 18 carbon atoms), or a group in which a part or all of the hydrogen atoms of the above each group are substituted with fluorine atoms. Among them, a hydrogen atom, an alkyl group, or an fluorinated alkyl group is preferable.

$R^{13}$ is an alkyl group (preferably having 1 to 10 carbon atoms, more preferably having 1 to 6 carbon atoms). In addition, each of two $R^1$s, two $R^2$s, two $R^3$s, two $R^4$s, two $R^5$s, and two $R^{13}$s may be the same or different from each other.

The iodonium compound represented by the formula (2) or (3) can be synthesized by mixing a metal salt of sulfonic acid or an ammonium salt of sulfonic acid with iodonium halide in hot water and recovering the formed precipitate.

As the iodonium compound represented by the formula (2) or (3), any of the following compounds is particularly preferable.

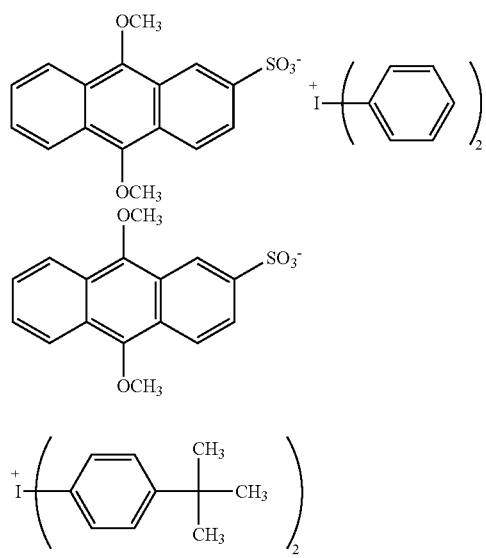

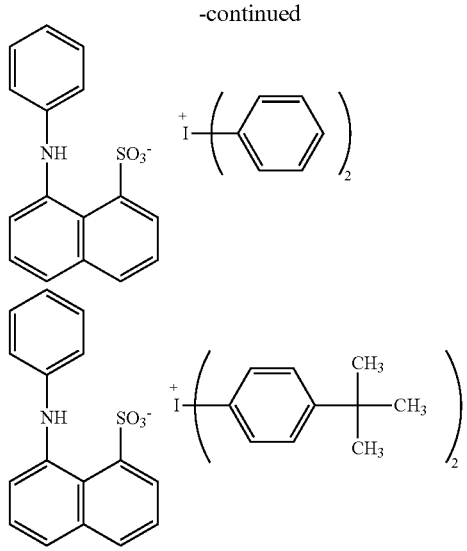

In addition, an iodonium compound represented by the formula (9) may be used in combination, for adjusting the dissolution rate of the unexposed part or the exposed part. The content can be appropriately adjusted so that the desired dissolution contrast can be achieved.

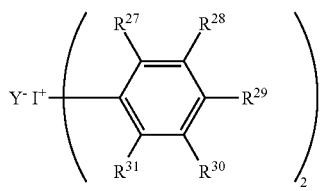

(9)

wherein in the formula, $R^{27}$ to $R^{31}$ each represent a hydrogen atom, a chlorine atom, a bromine atom, an iodine atom, a fluorine atom, an alkyl group (preferably having 1 to 10 carbon atoms, more preferably having 1 to 6 carbon atoms), an alkenyl group (preferably having 1 to 10 carbon atoms, more preferably having 1 to 6 carbon atoms), an alkoxy group (preferably having 1 to 10 carbon atoms, more preferably having 1 to 6 carbon atoms), a trialkylsilyl group (preferably having 1 to 30 carbon atoms, more preferably having 1 to 18 carbon atoms), or a group in which a part or all of the hydrogen atoms of the above each group are substituted with fluorine atoms; $Y^-$ represents a chloride ion, a bromide ion, a iodide ion, a fluoride ion, a nitrate ion, a methanesulfonate ion, a trifluoromethanesulfonate ion, a hexafluorophosphate ion, a benzenesulfonate ion or a p-toluenesulfonate ion.

The content of the iodonium compound is preferably 1 to 40 parts by mass, more preferably 3 to 30 parts by mass, relative to 100 parts by mass of the component (a).

The (e) component used in the resin composition of the present invention includes γ-butyrolactone, ethyl lactate, propylene glycol monomethyl ether acetate, benzyl acetate, n-butyl acetate, ethoxyethyl propionate, 3-methylmethoxypropionate, N-methyl-2-pyrrolidone, N,N-dimethylformamide, N,N-dimethylacetamide, dimethyl sulfoxide, hexamethylphosphoryl amide, tetramethylene sulfone, cyclohexanone, cyclopentanone, diethyl ketone, diisobutyl ketone, methylamyl ketone, and the like, and there is no particular limitation if it is capable of dissolving the other components constituting the resin composition of the present invention.

The content of the solvent is not particularly limited, but is preferably 10 to 800 parts by mass, more preferably 50 to 500 parts by mass, still more preferably 70 to 300 parts by mass, relative to 100 parts by mass of the component (a). Alternatively, it is preferable that the proportion of the solvent in the composition be 20 to 90 wt %.

The composition of the present invention may consist essentially of the components (a) to (e). For example, 70 wt % or more, 80 wt % or more, 90 wt % or more, or 95 wt % or more of the composition of the present invention may be the above components (a) to (e).

In addition to the components (a) to (e), the positive photosensitive resin composition of the present invention may further comprise (1) a silane coupling agent, (2) a surfactant or a leveling agent, (3) an anticorrosive agent, (4) a cyclization promoter, and the like. The content of these components can be appropriately adjusted so as to exhibit the desired characteristics.

[Method for Producing Patterned Cured Film]

The patterned cured film of the invention is a patterned cured film of the positive photosensitive resin composition of the invention.

An explanation will be given on the method for producing a patterned cured film of the invention. By the method for producing a patterned cured film of the invention, a patterned cured film of polybenzoxazole can be obtained by a resin film-forming step in which the positive photosensitive resin composition as mentioned above is applied to a substrate, followed by drying to form a resin film; a light exposure step in which the resin film is exposed to light with a prescribed pattern; a development step in which the resin film after the light exposure is developed by using an aqueous alkaline solution to obtain a patterned resin film; and a heat-treatment step in which the patterned resin film is heat-treated to obtain a patterned cured film. Hereinbelow, an explanation will be made on an embodiment of each step.

(Resin Film-Forming Step)

First, in this step, the positive photosensitive resin composition of the invention is spin-coated on a substrate such as a glass substrate, a semiconductor, a metal oxide insulator (for example, $TiO_2$ and $SiO_2$), silicon nitride or the like by using a spinner or the like, followed by drying by using a hot plate, an oven or the like. As a result, a resin film that is a coating film of a positive photosensitive resin composition can be obtained. The thickness of this resin film is preferably 7 μm to 35 μm in respect of coating property. Further, in respect of further enhancing the effects of the invention, the thickness is preferably 15 μm to 35 μm, with 20 μm to 35 μm being more preferable.

(Light Exposure Step)

Subsequently, in the light exposure step, light exposure is conducted by irradiating the resin film that becomes a coating film on the substrate with i-ray with a prescribed pattern through a mask.

It is preferred that the light exposure amount required for the positive photosensitive resin composition of the invention be set such that the conversion ratio of the diazonaphthoquinone compound at the bottom part of the film when exposing a resin film (coating film) having a thickness of 20 μm or more to i-ray becomes 70% or more. The light exposure amount is more preferably 2000 $mJ/cm^2$ or less, further preferably 1500 $mJ/cm^2$ or less and particularly preferably 1000 $mJ/cm^2$ or less.

The conversion ratio of the diazonaphthoquinone compound at the bottom part of the film can be obtained as follows. Specifically, for the intensity of 405 nm that is a maximum absorption of the diazonaphthoquinone compound, by using a graph obtained by plotting the intensities when the light exposure amount was changed at every 100 $mJ/cm^2$, the intensity at the light exposure amount of 0 $mJ/cm^2$ was taken as a conversion ratio of 0% and the intensity at the light exposure amount of 3000 $mJ/cm^2$ was taken as a conversion ratio of 100%. Based on the graph, the conversion ratio can be obtained by the method described in the following literature.

F. H. Dill and 3 others: Characterization of Positive Photoresist, IEEE Trans. Electron Devices, vol. ED-22, No. 7, pp 445-452, 1975

(Development Step)

In the development step, a patterned cured film is obtained by removing an exposed part of the resin film irradiated with i-ray with a developing solution. As the developing solution, aqueous alkaline solutions of sodium hydroxide, potassium hydroxide, sodium silicate, ammonia, ethylamine, diethylamine, triethylamine, triethanolamine, tetramethylammonium hydroxide and the like are preferable. The developing solution may be used after adding alcohols and surfactants.

(Heat-Treatment Step)

Subsequently, in the heat-treatment step, by subjecting the pattern obtained after the development to a heat treatment, a dehydration ring closure reaction proceeds, whereby a patterned cured film containing polybenzoxazole can be formed. The heating temperature in the heat-treatment step is preferably 150 to 350° C., more preferably 150 to 300° C., and further preferably 200 to 300° C.

[Process of Producing Semiconductor Device]

Figure 8:
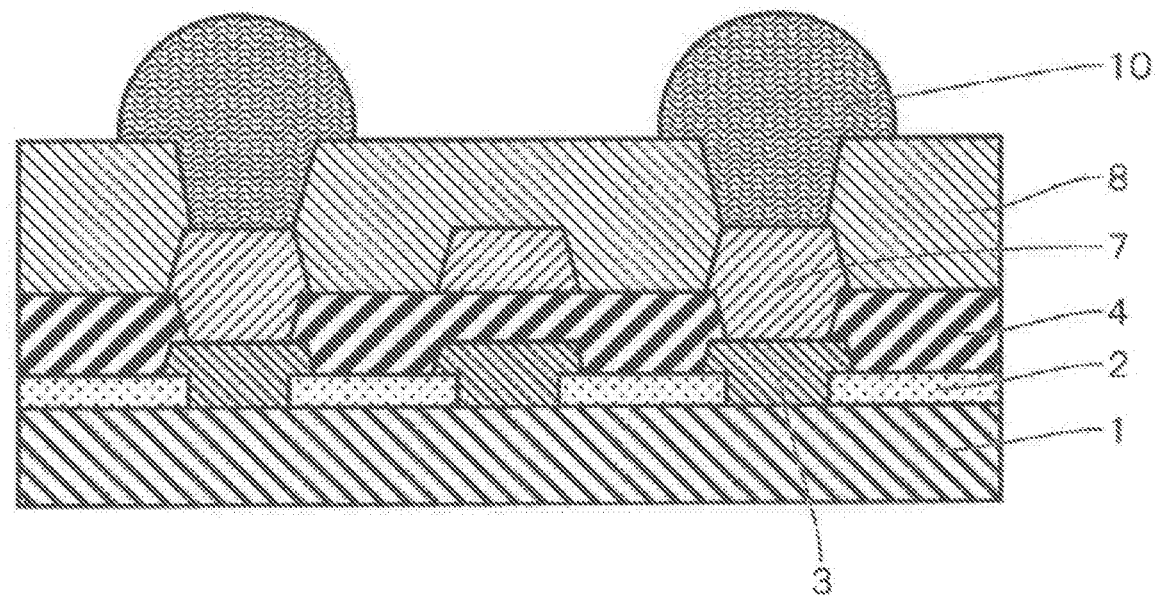
FIG. 8 is a schematic cross-sectional view showing a semiconductor device having a UBM free structure fabricated by using the positive photosensitive resin composition of the invention.

Subsequently, as one example of the method for producing a pattern according to the invention, a process of producing a semiconductor device will be explained with reference to the drawings. FIGS. 1 to 7 are each schematic cross-sectional views for explaining the process for producing a semiconductor device having a multilayer wire structure, and show a series of steps from a first step to a seventh step. FIG. 8 is a schematic cross-sectional view of a semiconductor device having a UBM (Under Bump Metal) free structure.

In these figures, a semiconductor substrate 1 such as a Si substrate having a circuit element (not shown) is covered by a protective film 2 such as a silicon oxidized film excluding a prescribed part of the circuit element, and a first conductor layer 3 is formed on the exposed circuit element.

On the semiconductor substrate, a film such as a polyimide resin film or the like as an interlayer insulating film 4 is formed as a spin coating method, etc. (first step, FIG. 1).

Figure 2:
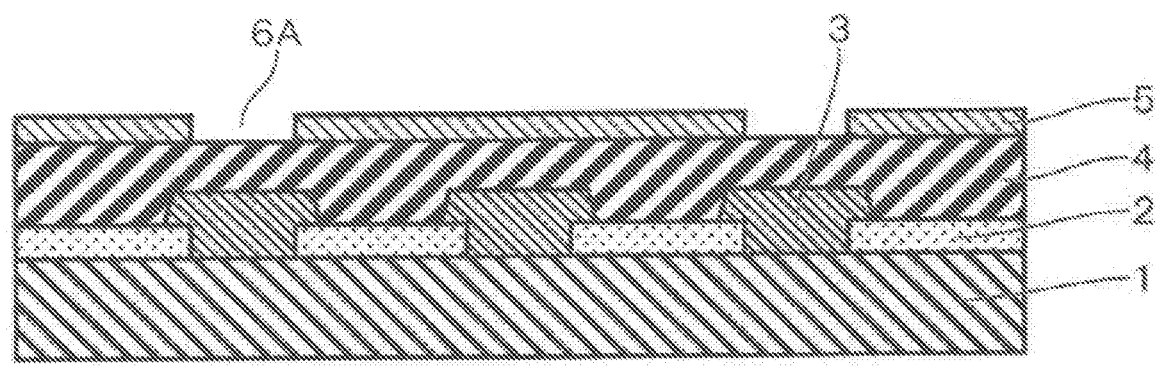
FIG. 2 is a schematic cross-sectional view showing a second step for producing a semiconductor device that is fabricated by using the positive photosensitive resin composition of the invention.
Figure 3:
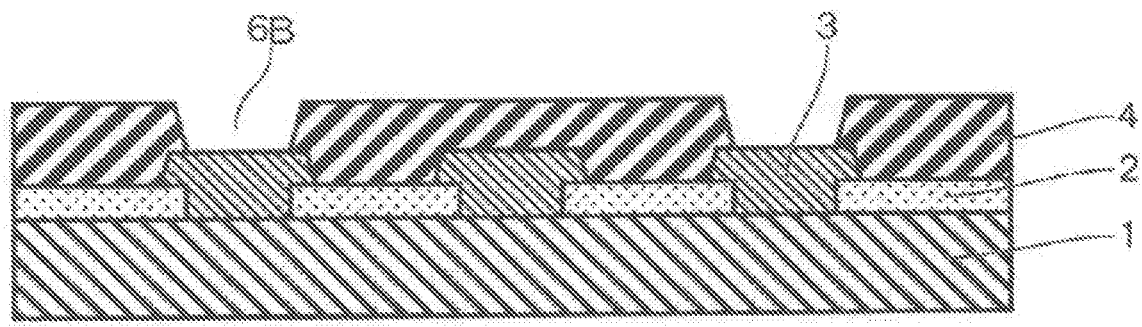
FIG. 3 is a schematic cross-sectional view showing a third step for producing a semiconductor device that is fabricated by using the positive photosensitive resin composition of the invention.

Subsequently, a photosensitive resin layer 5 such as a chlorinated rubber-based resin layer or a phenol novolac-based resin layer is formed on the interlayer-insulating film 4 by a spin coating method, and a window 6A is provided such that a predetermined part of the interlayer-insulating film 4 is exposed by a known method by using this resin film as a mask (second step, FIG. 2). The interlayer-insulating film 4 exposed in this window 6A part is selectively etched by dry etching means using a gas such as carbon or carbon tetrafluoride, whereby a window 6B is formed. Subsequently, by using an etching solution that corrodes only the photosensitive resin layer 5 without corroding the first conductor layer 3 exposed from the window 6B, the photosensitive resin layer 5 is completely removed (third step, FIG. 3).

Figure 4:
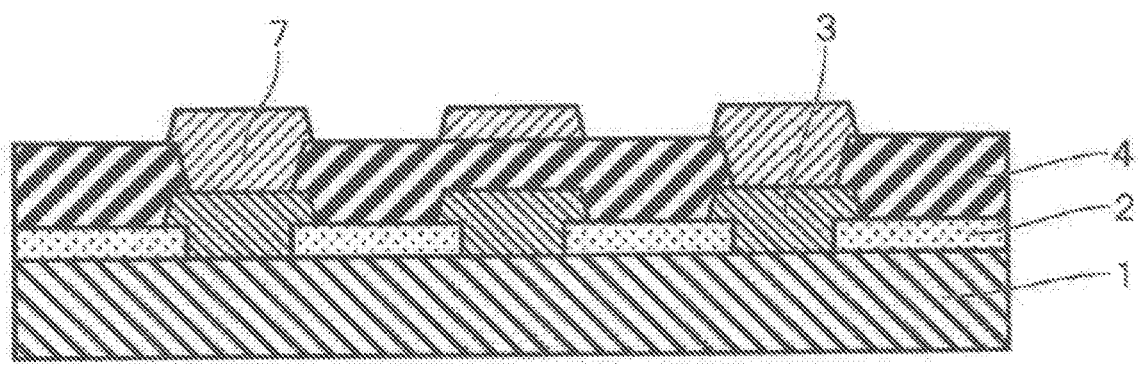
FIG. 4 is a schematic cross-sectional view showing a fourth step for producing a semiconductor device that is fabricated by using the positive photosensitive resin composition of the invention.
Figure 5:
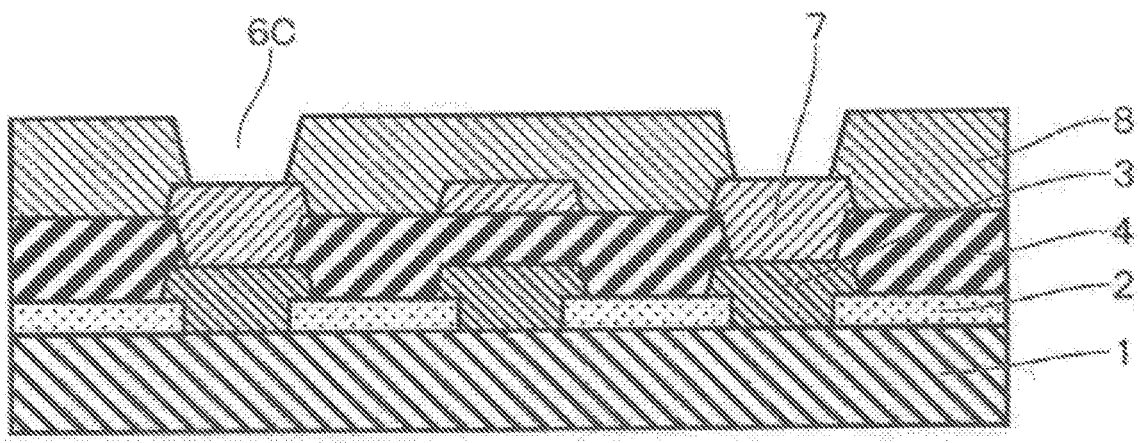
FIG. 5 is a schematic cross-sectional view showing a fifth step for producing a semiconductor device that is fabricated by using the positive photosensitive resin composition of the invention.
Figure 6:
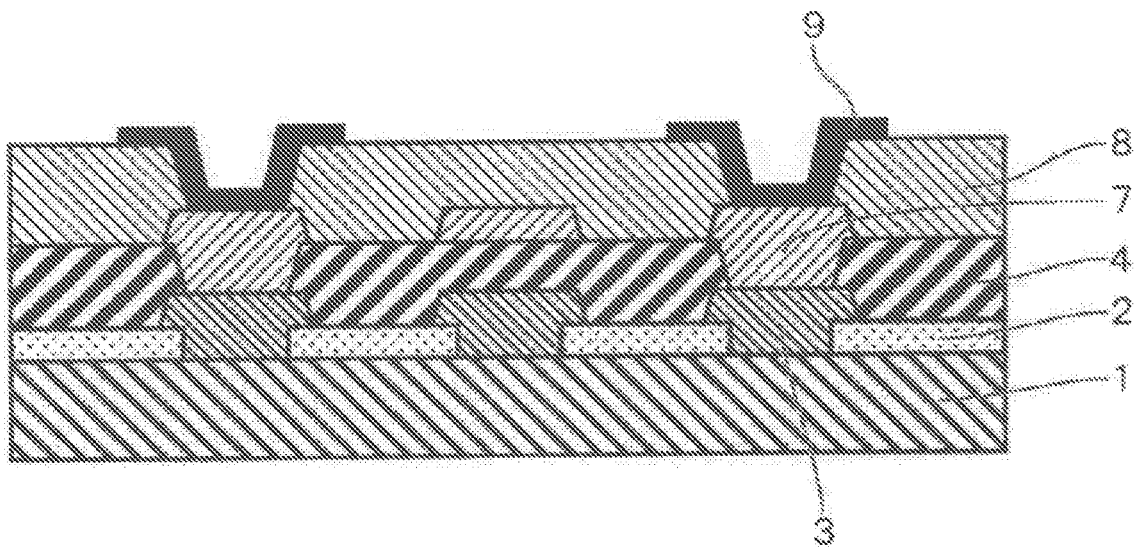
FIG. 6 is a schematic cross-sectional view showing a sixth step for producing a semiconductor device that is fabricated by using the positive photosensitive resin composition of the invention.
Figure 7:
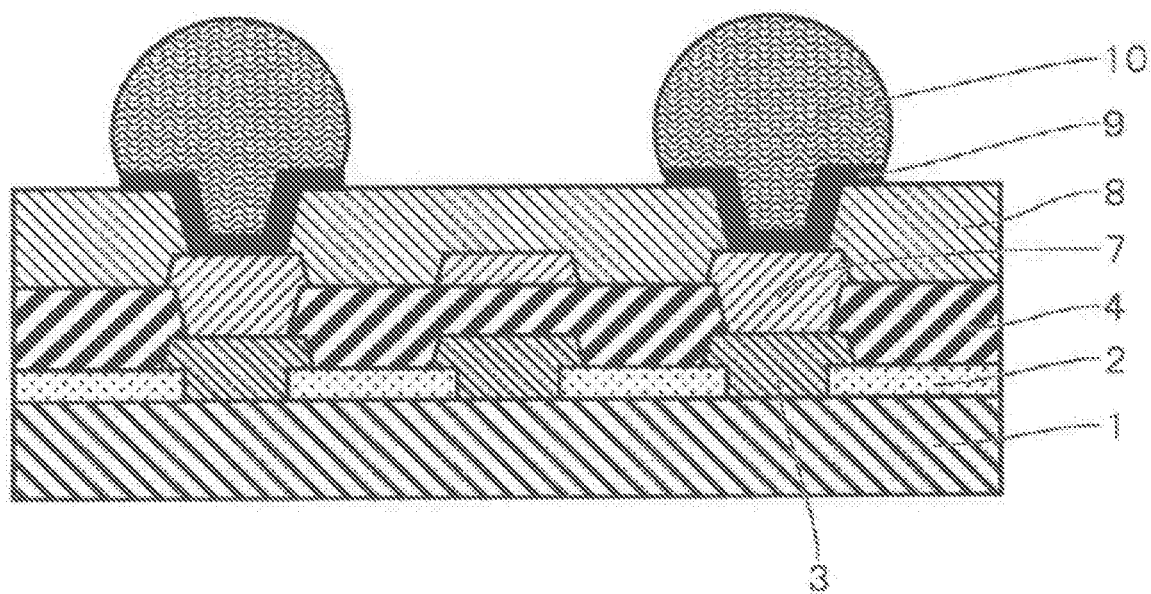
FIG. 7 is a schematic cross-sectional view showing a seventh step for producing a semiconductor device that is fabricated by using the positive photosensitive resin composition of the invention.

Further, by using a known method, a second conductor layer 7 is formed, and the formed second conductor layer is electrically connected with the first conductor layer 3 (fourth step, FIG. 4). When forming a multilayer wire structure composed of three or more layers, each layer is formed by repeating the above-mentioned steps.

Subsequently, a surface protective film 8 is formed as follows by using the positive photosensitive resin composition of the invention. That is, the resin composition of the invention is coated by spin coating, and dried. Then, the resulting film is irradiated with light through a mask in which a pattern for forming a window 6C at a prescribed part is drawn, and then, development is conducted with an aqueous alkaline solution to form a patterned resin film. Thereafter, this patterned resin film is heated to allow it to be a patterned cured film of polybenzoxazole as a surface protective film 8 (fifth step, FIG. 5). This surface protective film (patterned cured film of polybenzoxazole) 8 has a function of protecting the conductor layer from a stress from the outside, α-ray, etc.

Further, normally, after forming a metal thin film by sputtering on the surface of the surface protective film 8, a plating resist is formed by a known method in conformity with the window 6C, and, a metal layer 9 called UBM (Under Bump Metal) is deposited by plating in the exposed metal thin film part. Then, the plating resist is peeled off and a metal foil film in a region other than a region in which UBM 9 is formed is removed by etching, whereby UBM is formed (sixth step, FIG. 6). Further, an external connecting terminal 10 called a bump is formed on the surface of the metal layer 9 (seventh step, FIG. 7). The metal layer 9 is formed in order to relax the stress acting on the bump 10 or to improve reliability in electrical connection.

However, in recent years, in respect of reducing production cost, in order to omit such step of forming the metal layer 9 (UBM), proposed is a UBM-free structure in which the bump 10 is directly formed after the window 6C is formed on the surface protective film 8. In the UBM free structure, in order to suppress an increase in electrical resistance due to formation of an inter-metal compound, it is required to form the second conductor layer 7, which is connected with the bump 10, in a thickness larger than usual. Further, the stress acting on the bump 10 is required to be relaxed only by the surface protective film 8. For this purpose, in order to coat the second conductor layer 7 that is formed to have a large thickness and to enhance the stress relaxing performance, it is required to form the surface protective film 8 in a large thickness (FIG. 8).

Therefore, in the UBM free structure, when forming the window 6C in the above-mentioned surface protective film 8, it is required to apply a resin film in a larger thickness, and to subject the film to light exposure and development. The positive photosensitive resin composition of the invention can be particularly preferably used in the surface protective film in this UBM free structure. In this case, the thickness of the surface protective film is preferably 15 μm or more, more preferably 17 μm or more, further preferably 18 μm or more, and particularly preferably 20 μm or more.

No specific restrictions are imposed on the upper limit, but the upper limit is preferably 50 μm or less.
[Electronic Component]

Subsequently, an explanation will be made on the electronic component of the invention. This electronic component has a patterned cured film of the above-mentioned positive photosensitive resin composition. As electronic components, a semiconductor device, a multilayer wiring plate, various electronic devices, etc. can be given.

Specifically, the above-mentioned patterned cured film can be used as a surface protective film or an interlayer-insulating film of electronic components, an interlayer-insulating film of a multilayer wiring plate, etc. Among them, it can be particularly preferably used as a surface protective film in the above-mentioned UBM free structure.

EXAMPLES

Hereinbelow, the invention will be explained further specifically based on the Examples and the Comparative Examples, which should not be construed as limiting the scope of the invention.
[Synthesis of Polybenzoxazole Precursor]

Synthesis Example 1

In a 0.2-liter flask equipped with a stirrer and a thermometer, 60 g of N-methylpyrrolidone was charged and 14.65 g (40 mmol) of 2,2'-bis(3-amino-4-hydroxyphenyl)hexafluoropropane was added, and dissolved by stirring. Subsequently, while keeping the temperature at 0 to 5° C., 8.55 g (32 mmol) of dodecanedioic acid dichloride and 2.36 g (8 mmol) of 4,4'-diphenylether dicarboxylic acid dichloride were each added over a period of 10 minutes. Thereafter, the temperature was returned to room temperature, and stirring was continued for 3 hours. The solution was poured to 3 liters of water, and deposited substances were collected. The collected substances were washed three times with pure water, and the pressure was reduced to obtain polyhydroxyamide (polybenzoxazole precursor) (hereinafter referred to as "polymer 1"). The weight-average molecular weight of polymer 1 obtained by the GPC method (converted by standard polystyrene) was 39,500 and the degree of dispersion was 1.9.
(Measurement Conditions of the Weight-Average Molecular Weight by the GPC Method)
Measuring device: Detector "L4000UV" manufactured by Hitachi, Ltd.
Pump: "L6000" manufactured by Hitachi, Ltd.
"C-R4 A Chromatopac" manufactured by Shimadzu Corporation
Measurement conditions: Column "Gelpack GL-S300MDT-5"×2
Eluent: THF/DMF=1/1 (volume ratio)
LiBr (0.03 mol/l), $H_3PO_4$ (0.06 mol/l)
Flow rate: 1.0 ml/min
Detector: UV 270 nm
Measurement was conducted by using a solution composed of 1 ml of a solvent [THF/DMF=1/1 (volume ratio)] relative to 0.5 mg of the polymer.

Synthesis Example 2

Polymer 2 was obtained in the same manner as in Synthesis Example 1, except that dodecanedioic acid dichloride was changed to 5.86 g (32 mmol) of sebacinic acid dichloride. The weight-average molecular weight of polymer 2 obtained by the GPC method (converted by standard polystyrene) was 35,000 and the degree of dispersion was 2.0.

Synthesis Example 3

Polymer 3 was obtained in the same manner as in Synthesis Example 1, except that dodecanedioic acid dichloride was changed to 7.94 g (32 mmol) of cyclohexanedicarboxylic acid dichloride. The weight-average molecular weight of polymer 3 obtained by the GPC method (converted by standard polystyrene) was 38,000 and the degree of dispersion was 1.7.

Synthesis Example 4

Polymer 4 was obtained in the same manner as in Synthesis Example 1, except that only 11.80 g (40 mmol) of 4,4'-dipheylether dicarboxylic acid dichloride was used without using dodecanic acid dichloride. The weight-average molecular weight of polymer 4 obtained by the GPC method (converted by standard polystyrene) was 20,000 and the degree of dispersion was 1.9.

[Synthesis of Component (d)]

Synthesis Example 5

In a 0.5-liter flask equipped with a stirrer and a thermometer, 150 mL of ionic exchange water was charged and 4.3 g (14 mmol) of diphenyl iodonium chloride was added, and dissolved by stirring under heating at 100° C. Further, separately, in a 1.0-liter flask provided with a stirrer and a thermometer, 300 mL of ionic exchange water was charged, and 4.7 g (14 mmol) of sodium 9,10-dimethoxyanthracenesulfonate was added, and dissolved by stirring under heating at 100° C. Subsequently, an aqueous solution of diphenyliodonium chloride was poured to an aqueous solution of sodium 9,10-dimethoxyanthracene sulfonate, and stirring was conducted for 3 hours until the temperature was returned to room temperature. The deposited substance were collected, and washed three times with pure water, and dried under reduced pressure, whereby obtaining diphenyliodonium-9,10-dimethoxyanthracene-2-sulfonate (d1).

Synthesis Example 6

In a 0.5-liter flask equipped with a stirrer and a thermometer, 300 mL of ionic exchange water was charged and 10.0 g (32 mmol) of diphenyliodonium chloride was added, and dissolved by stirring under heating at 100° C. Further, separately, in a 1.0 liter-flask provided with a stirrer and a thermometer, 300 mL of ionic exchange water was charged, and 10.0 g (32 mmol) of ammonium 8-anilino-1-naphthalenesulfonate was added, and dissolved and stirred under heating at 100° C. Subsequently, an aqueous solution of diphenyliodonium chloride was poured to the aqueous solution of ammonium 8-anilino-1-naphthalene sulfonate, and stirring was conducted for 3 hours until the temperature was returned to room temperature. The deposited substance were collected, and washed three times with pure water, and dried under reduced pressure, whereby obtaining diphenyl iodonium-8-anilinonaphthalene-1-sulfonate (d2).

Examples 1 to 12 and Comparative Examples 1 to 8

The positive photosensitive resin compositions of Examples 1 to 12 and Comparative Examples 1 to 8 were prepared in accordance with the compositions shown in Tables 1 and 2. The contents shown in Tables 1 and 2 are parts by mass of other components than the polymer relative to 100 parts by weight of the polymer.

The components used are as follows:

[Polymer (Polybenzoxazole Precursor)]
a1: Polymer 1: synthesized in Synthesis Example 1
a2: Polymer 2: synthesized in Synthesis Example 2
a3: Polymer 3: synthesized in Synthesis Example 3
a4: Polymer 4: synthesized in Synthesis Example 4

[Cross-Linking Agent]
b1: "MX-270" (product name) having the following structure (manufactured by Sanwa Chemical Industries, Co., Ltd.):

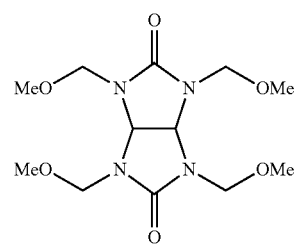 [SMILES: COCN1C(=O)N(COC)C2C1N(COC)C(=O)N2COC]

[Diazonaphthoquinone (DNQ) Compound]
c1: "TPPA528" (product name) having the following structure (manufactured by Daito Chemix Co., Ltd.):

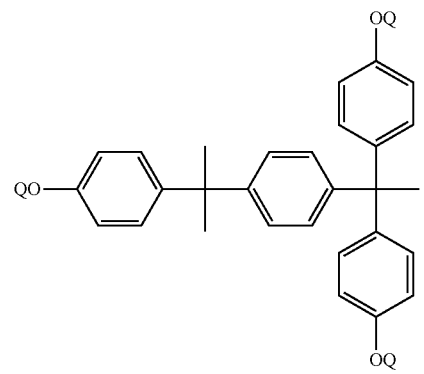

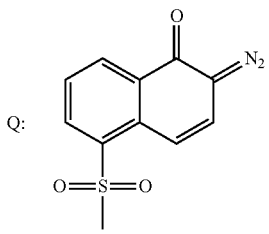

Q:

c2: "TPPA428" (product name) having the following structure (manufactured by Daito Chemix Co., Ltd.):

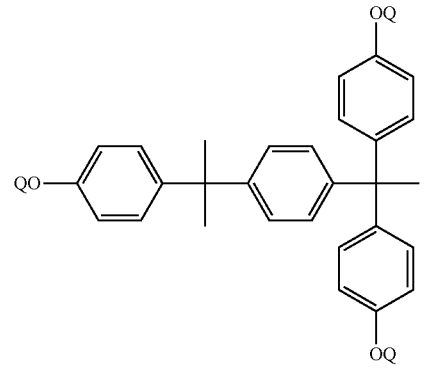

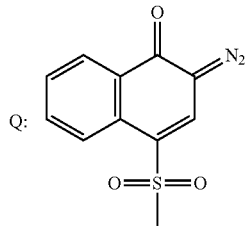

Q:

[Dissolution Inhibitor (Iodonium Compound)]
d1: Diphenyl iodonium-9,10-dimethoxyanthracene-2-sulfonate (DIAS) having the following structure synthesized in Synthesis Example 5:

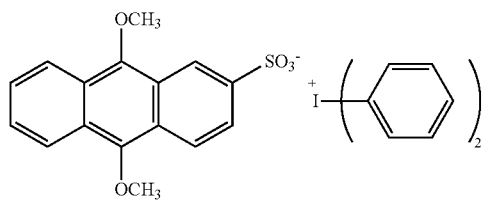

d2: Diphenyliodonium-8-anilinonaphthalene-1-sulfonate (DIANS) having the following structure synthesized in Synthesis Example 6:

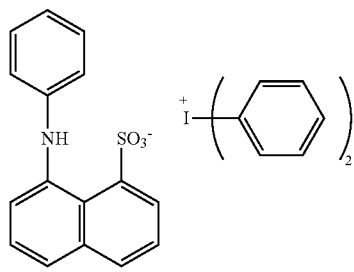

d3: "Diphenyliodonium nitrate" (product name) having the following structure (manufactured by Toyo Gosei, Co., Ltd.):

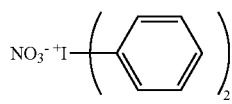

[Solvent]
e1: γ-Butyrolactone (BLO)

For the positive photosensitive resin compositions in Examples 1 to 12 and Comparative Examples 1 to 8, sensitivity, dissolution speed of an unexposed part, dissolution speed of an exposed part, dissolution contrast, developability, residual film ratio, resolution and pattern peeling were evaluated by the following methods. The results are shown in Table 1 and Table 2.

(Sensitivity)

The positive photosensitive resin composition was applied on a silicon wafer by spin coating, and the resultant was dried by heating at 120° C. for 3 minutes, whereby obtaining resin films (coating film) having the film thicknesses shown in Tables 1 and 2. Then, the light exposure amount required to attain a conversion ratio of 70% or more of the diazonaphthoquinone compound in the bottom part of the coating film was obtained. The conversion ratio was obtained by the method described in the above-mentioned literature. A case where the light exposure amount was 1500 mJ/cm$^2$ or less was evaluated as A, a case where the light exposure amount was larger than 1500 mJ/cm$^2$ and 2500 mJ/cm$^2$ or less was evaluated as B, and a case where the light exposure amount was larger than 2500 mJ/cm$^2$ was evaluated as C.

(Dissolution Speed of Unexposed Part)

The positive photosensitive resin composition was applied on a silicon wafer by spin coating, and the resultant was dried by heating at 120° C. for 3 minutes, whereby obtaining resin films (coating film) having the film thicknesses shown in Tables 1 and 2. The resulting films were immersed in a 2.38 mass % aqueous solution of tetramethylammonium hydroxide (TMAH) for 80 seconds, followed by rinsing with water. A change in film thickness before and after the immersion was measured by a contact-type thickness meter. A value obtained by dividing a change in film thickness with an immersion time (80 seconds) was taken as the dissolution speed of an unexposed part. A case where the dissolution speed was 50 nm/sec or less was evaluated as A, a case where the dissolution speed was more than 50 nm/sec and 100 nm/sec or less was evaluated as B and a case where the dissolution speed was more than 100 nm/sec was evaluated as C.

(Dissolution Speed of Exposed Part)

The positive photosensitive resin composition was applied on a silicon wafer by spin coating, and the resultant was dried by heating at 120° C. for 3 minutes, whereby obtaining resin films (coating film) having thicknesses shown in Tables 1 and 2. The resulting coating films were exposed to light in a light exposure amount corresponding to the sensitivity that had been estimated in advance (a light exposure amount required to allow a conversion ratio of diazonaphoquinone compound in the bottom part of the coating film to be 70% or more) by means of a proximity exposure apparatus (product name "UX-1000SM-XJ01," manufactured by Ushio Inc.) through an i-ray filter. After the light exposure, the film was immersed in a 2.38 mass % aqueous solution of tetramethylammonium hydroxide (TMAH), and the time taken until the silicon wafer was exposed was measured. A value obtained by dividing the film thickness before immersion by the time until the silicon wafer was exposed was taken as the dissolution speed of an exposed part. A case where the dissolution speed of an exposed part was 200 nm/sec or more was evaluated as A, a case where the dissolution speed was 100 nm/sec or more and less than 200 nm/sec was evaluated as B, and a case where the dissolution speed was less than 100 nm/sec was evaluated as C.

(Dissolution Contrast)

A value obtained by dividing the dissolution speed of an exposed part by the dissolution speed of an unexposed part was taken as a dissolution contrast. A case where the dissolution contrast was 7 or more was taken as A, a case where the dissolution contrast was 3 or more and smaller than 7 was taken as B and a case where the dissolution contrast was smaller than 3 was taken as C.

(Developability)

The positive photosensitive resin composition was applied on a silicon wafer by spin coating, and the resultant was dried by heating at 120° C. for 3 minutes, whereby obtaining resin films (coating film) having thicknesses shown in Tables 1 and 2. The resulting coating films were exposed to light in a light exposure amount corresponding to the sensitivity that was estimated in advance (a light exposure amount required to allow a conversion ratio of diazonaphotoquinone compound in the bottom part of the coating film to be 70% or more) by means of a proximity exposure apparatus (product name "UX-1000SM-XJ01," manufactured by Ushio Inc.) through an i-ray filter. After the light exposure, paddle development was conducted in a 2.38 mass % aqueous solution of tetramethylammonium hydroxide (TMAH), whereby obtaining a patterned resin film. The development time was 1.5 times longer than the time taken until silicon wafer of the exposed part that had been measured in advance. A case where the development time was 200 seconds or shorter was evaluated as A, a case where the development time was longer than 200 seconds and 300 seconds or shorter was evaluated as B, and a case where the development time was longer than 300 seconds was evaluated as C.

(Residual Film Ratio)

For the patterned resin film prepared for the evaluation of developability, a value obtained by dividing the film thickness after development by the film thickness before development was taken as a residual film ratio. A case where the residual film ratio was 75% or more was evaluated as A, a case where the residual film ratio was 60% or more and less than 75% was taken as B and a case where the residual film ratio was less than 60% was taken as C.

(Resolution)

Further, for the patterned resin film prepared for evaluating developability, one in which the minimum openable pattern dimension was 30 μm or less was evaluated as A, one in which the minimum openable pattern dimension was larger than 30 μm and 50 μm or less was evaluated as B, and one in which the minimum openable pattern dimension was larger than 50 μm was evaluated as C.

(Pattern Peeling)

Further, for the patterned resin film prepared for evaluating developability, one in which no pattern peeling occurred was evaluated as A and one in which pattern peeling occurred was evaluated as B.

TABLE 1

| | | | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|---|
| Polymer | a1 | Polymer 1 | 100 | 100 | 100 | — | — | 100 | 100 | 100 | 100 | — | 70 | 70 |
| | a2 | Polymer 2 | — | — | — | 100 | — | — | — | — | — | — | — | — |
| | a3 | Polymer 3 | — | — | — | — | 100 | — | — | — | — | 100 | — | — |
| | a4 | Polymer 4 | — | — | — | — | — | — | — | — | — | — | 30 | 30 |
| Crosslinking agent | b1 | MX-270 | 25 | 25 | 25 | 25 | 10 | 15 | 35 | 25 | 25 | 10 | 15 | 15 |
| DNQ | c1 | TPPA528 | 11 | — | 11 | 11 | 11 | 11 | 11 | 11 | 11 | 11 | 11 | 11 |
| | c2 | TPPA428 | — | 11 | — | — | — | — | — | — | — | — | — | — |
| Dissolution inhibitor | d1 | DIAS | 12 | 12 | 12 | 12 | 20 | 12 | 12 | — | — | — | 12 | — |
| | d2 | DIANS | — | — | — | — | — | — | — | 12 | 12 | 20 | — | 12 |
| | d3 | DPIN | — | — | — | — | — | — | — | — | — | — | — | — |
| Solvent | e1 | BLO | 150 | 150 | 150 | 150 | 150 | 150 | 150 | 150 | 150 | 150 | 150 | 150 |
| Film thickness | | | 20 | 20 | 30 | 20 | 20 | 20 | 20 | 20 | 30 | 20 | 20 | 20 |
| Sensitivity | | | A | A | B | A | A | A | A | A | B | A | A | A |
| Dissolution speed of unexposed part | | | A | A | A | A | B | A | A | A | A | B | A | A |
| Dissolution speed of exposed part | | | A | A | B | A | A | A | A | A | A | A | A | A |
| Dissolution contrast | | | A | A | A | A | A | A | A | A | A | A | A | A |
| Developability | | | A | A | B | A | A | A | A | A | B | A | A | A |
| Residual film ratio | | | A | A | A | A | A | A | A | A | A | A | A | A |
| Resolution | | | A | A | A | A | A | A | A | A | A | A | A | A |
| Pattern peeling | | | A | A | A | A | A | A | A | A | A | A | A | A |

TABLE 2

| | | | Comparative example 1 | Comparative example 2 | Comparative example 3 | Comparative example 4 | Comparative example 5 | Comparative example 6 | Comparative example 7 | Comparative example 8 |
|---|---|---|---|---|---|---|---|---|---|---|
| Polymer | a1 | Polymer 1 | 100 | 100 | — | — | — | 100 | 100 | 100 |
| | a2 | Polymer 2 | — | — | 100 | — | — | — | — | — |
| | a3 | Polymer 3 | — | — | — | 100 | — | — | — | — |
| | a4 | Polymer 4 | — | — | — | — | 100 | — | — | — |
| Crosslinking agent | b1 | MX-270 | 25 | 25 | 25 | 10 | 10 | 25 | 25 | 25 |
| DNQ | c1 | TPPA528 | 11 | 11 | 11 | 11 | 11 | 11 | 22 | 5 |
| | c2 | TPPA428 | — | — | — | — | — | — | — | — |
| Dissolution inhibitor | d1 | DIAS | — | — | — | — | 12 | — | — | — |
| | d2 | DIANS | — | — | — | — | — | — | — | — |
| | d3 | DPIN | 6 | 6 | 6 | 15 | — | — | — | 10 |
| Solvent | e1 | BLO | 150 | 150 | 150 | 150 | 150 | 150 | 150 | 150 |
| Film thickness | | | 20 | 30 | 20 | 20 | 20 | 20 | 20 | 20 |
| Sensitivity | | | A | A | A | A | C | A | C | A |
| Dissolution speed of unexposed part | | | A | A | A | B | A | C | A | A |

TABLE 2-continued

| | Comparative example 1 | Comparative example 2 | Comparative example 3 | Comparative example 4 | Comparative example 5 | Comparative example 6 | Comparative example 7 | Comparative example 8 |
|---|---|---|---|---|---|---|---|---|
| Dissolution speed of exposed part | B | B | B | A | B | A | A | C |
| Dissolution contrast | B | B | B | B | B | C | A | C |
| Developability | B | C | B | B | A | A | A | C |
| Residual film ratio | B | C | B | C | A | C | A | A |
| Resolution | A | C | A | C | A | C | B | B |
| Pattern peeling | B | B | B | B | A | B | B | A |

From the results of evaluation shown in Tables 1 and 2, the positive photosensitive resin compositions of the invention exhibit excellent sensitivity even with a large thickness of 20 μm or more and is capable of realizing a high dissolution contrast and a high residual film ratio, and has a good patterning property.

Further, the film thicknesses of the patterned cured films obtained by heating the patterned resin films prepared in evaluation of developability in Examples 1 to 12 at 200° C. for 1 hour were each 15 μm or more.

INDUSTRIAL APPLICABILITY

The photosensitive resin composition of the invention can be used in an electronic component for a semiconductor device, a multilayer wiring plate and various other electronic devices.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A positive photosensitive resin composition comprising the following components (a) to (e):
   (a) a polybenzoxazole precursor comprising a structural unit represented by the following formula (1):

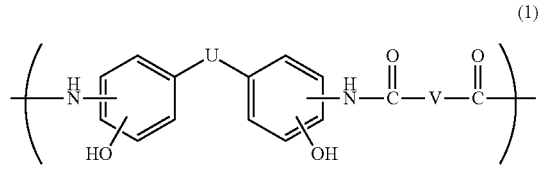

(1)

wherein in the formula, U is a divalent organic group and V is a divalent organic group comprising an aliphatic chain structure or an alicyclic structure;
   (b) a cross-linking agent;
   (c) a diazonaphthoquinone compound;
   (d) an iodonium compound represented by the following formula (2) or (3);

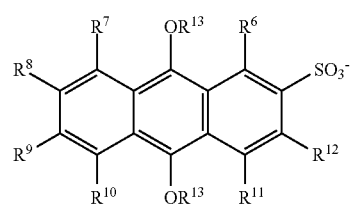

(2)

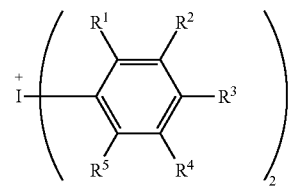

(3)

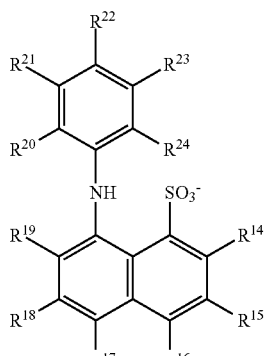

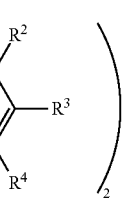

wherein in the formula, $R^1$ to $R^{12}$ and $R^{14}$ to $R^{24}$ are independently a hydrogen atom, a chlorine atom, a bromine atom, an iodine atom, a fluorine atom, an alkyl group, an alkenyl group, an alkoxyl group, a trialkylsilyl group or a group in which a part or all of hydrogen atoms in each of the above-mentioned groups are substituted by a fluorine atom; $R^{13}$ is an alkyl group; and two $R^1$s, two $R^2$s, two $R^3$s, two $R^4$s, two $R^5$s and two $R^{13}$s may be the same as or different from each other; and
   (e) a solvent.

2. The positive photosensitive resin composition according to claim 1, wherein the component (a) is a polybenzoxazole precursor having a structure represented by the following formula (4):

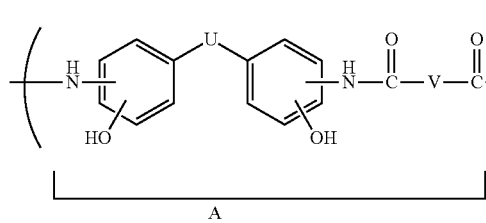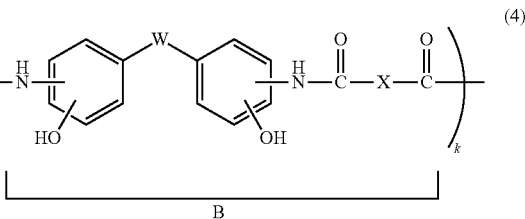

(4)

wherein A and B are structural units;
U is a divalent organic group;
V is a divalent organic group comprising an aliphatic chain structure or an alicyclic structure;
W is a divalent organic group;
X is a divalent organic group which comprises neither an aliphatic structure nor an alicyclic structure; and
j and k each represent a polymerization ratio in terms of moles of the structural units A and B, j is a value of 1 or more, and j+k is 100.

3. The positive photosensitive resin composition according to claim 1 that further comprises the following component (a'):
(a') a polybenzoxazole precursor that comprises a structural unit represented by the following formula (5) and does not comprise a structural unit represented by the above formula (1):

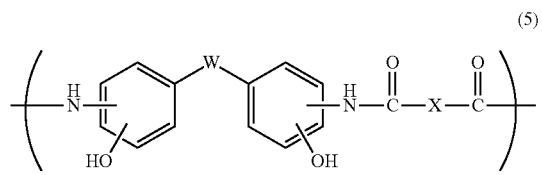

(5)

wherein W is a divalent organic group and X is a divalent organic group that comprises neither an aliphatic chain structure nor an aliphatic structure.

4. The positive photosensitive resin composition according to claim 1, which is used for a surface protective film of a semiconductor device having an under-bump metal free structure.

5. A method for producing a patterned cured film comprising:
a resin film-forming step in which the positive photosensitive resin composition according to claim 1 is applied to a substrate, followed by drying to form a resin film;
a light exposure step in which the resin film is exposed to light with a prescribed pattern;
a development step in which the resin film after the light exposure is developed by using an aqueous alkaline solution to obtain a patterned resin film; and
a heat-treatment step in which the patterned resin film is heat-treated to obtain a patterned cured film.

6. The method for producing a patterned cured film according to claim 5, wherein the thickness of the resin film is 20 µm or more, and the thickness of the patterned cured film is 15 µm or more.

7. A patterned cured film produced by the method for producing a patterned cured film according to claim 5.

8. An electronic component comprising the patterned cured film according to claim 7.

9. The positive photosensitive resin composition according to claim 1, wherein the component (d) comprising the iodonium compound represented by the formula (3).

\* \* \* \* \*